United States Patent
Pyznar

(10) Patent No.: US 11,170,489 B2
(45) Date of Patent: *Nov. 9, 2021

(54) SYSTEM AND METHOD FOR INSPECTING THE CONDITION OF STRUCTURES USING REMOTELY CONTROLLED DEVICES

(71) Applicant: William Pyznar, Miami, FL (US)

(72) Inventor: William Pyznar, Miami, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 16/747,337

(22) Filed: Jan. 20, 2020

(65) Prior Publication Data

US 2020/0151867 A1   May 14, 2020

Related U.S. Application Data

(63) Continuation of application No. 16/109,543, filed on Aug. 22, 2018, now Pat. No. 10,546,371.

(51) Int. Cl.
*H04N 5/00* (2011.01)
*G06T 19/00* (2011.01)
(Continued)

(52) U.S. Cl.
CPC ......... *G06T 7/0002* (2013.01); *G01M 5/0033* (2013.01); *G01M 5/0066* (2013.01); *G06F 30/13* (2020.01); *H04N 5/33* (2013.01); *B64C 39/024* (2013.01); *B64C 2201/123* (2013.01); *G06T 19/00* (2013.01); *G06T 2207/10028* (2013.01); *G06T 2207/10032* (2013.01); *G06T 2207/10048* (2013.01);
(Continued)

(58) Field of Classification Search
CPC . G01M 5/0066; G01M 5/0033; G06T 7/0002; G06T 2207/10028; G06T 7/0004; G06T 2207/10032; G06T 2207/10132; G06T 2207/10048; G06T 2207/30184; G06T 19/00; G06T 2207/10024; G06T 2219/004; H04N 5/33; G06F 30/13; B64C 39/024; B64C 2201/123

See application file for complete search history.

(56) References Cited

U.S. PATENT DOCUMENTS

| 5,760,904 A * | 6/1998 | Lorraine | G01B 11/16 356/513 |
| 10,546,371 B1 * | 1/2020 | Pyznar | G06T 7/0002 |

(Continued)

OTHER PUBLICATIONS

Albris. "Albris: The intelligent mapping & inspection drone". (Year: 2017).*

*Primary Examiner* — Zhihan Zhou
(74) *Attorney, Agent, or Firm* — The Brickell IP Group, PLLC; Rafael A. Perez-Pineiro, Esq.

(57) ABSTRACT

Disclosed is a system for inspecting a structure without physically contacting the structure. The system includes a remotely controlled device that includes a sonar/ultrasound transceiver, a camera and a mapping module for generating geotags corresponding to the structure. The remotely controlled device optionally includes an infrared camera and a lidar. As the remotely controlled device moves along or around the perimeter of the structure, the system collects acoustic, lidar, infrared and photogrammetry data to create a virtual model of the structure. Geotagged acoustic, infrared and lidar data identifying faults in the structure is overlaid on the virtual model of the structure.

20 Claims, 7 Drawing Sheets

(51) Int. Cl.
*G06T 7/00* (2017.01)
*H04N 5/33* (2006.01)
*G01M 5/00* (2006.01)
*G06F 30/13* (2020.01)
*B64C 39/02* (2006.01)

(52) U.S. Cl.
CPC ............... *G06T 2207/10132* (2013.01); *G06T 2207/30184* (2013.01); *G06T 2219/004* (2013.01)

(56) References Cited

U.S. PATENT DOCUMENTS

| | | | | |
|---|---|---|---|---|
| 2009/0133501 | A1* | 5/2009 | Georgeson | G01N 29/221 73/632 |
| 2010/0004804 | A1* | 1/2010 | Anderson | B61L 23/042 701/19 |
| 2011/0007962 | A1* | 1/2011 | Johnson | G06F 16/9537 382/154 |
| 2013/0121373 | A1* | 5/2013 | Skliar | G01K 11/22 374/117 |
| 2013/0300830 | A1* | 11/2013 | Solem | G06T 7/74 348/46 |
| 2014/0184786 | A1* | 7/2014 | Georgeson | G01N 21/8422 348/128 |
| 2014/0210997 | A1* | 7/2014 | Blanchard | H04N 7/18 348/128 |
| 2015/0269438 | A1* | 9/2015 | Samarasekera | G06K 9/00637 382/154 |
| 2016/0332006 | A1* | 11/2016 | Slayton | G01S 15/8934 |
| 2017/0080258 | A1* | 3/2017 | Barthe | A61N 7/02 |
| 2017/0363582 | A1* | 12/2017 | Mertz | G01N 29/0681 |
| 2018/0095458 | A1* | 4/2018 | Sharber | B64C 39/024 |
| 2018/0283988 | A1* | 10/2018 | Ooe | G01M 13/045 |
| 2020/0151867 | A1* | 5/2020 | Pyznar | G01M 5/0066 |

* cited by examiner

SYSTEM AND METHOD FOR INSPECTING THE CONDITION OF STRUCTURES USING REMOTELY CONTROLLED DEVICES

CROSS REFERENCE TO RELATED APPLICATIONS

This application is a continuation of U.S. application Ser. No. 16/109,543 filed on Aug. 22, 2018, there entire contents of which are hereby incorporated by reference

FIELD OF THE INVENTION

Embodiments of the present invention generally relate to a system and method for surveying, testing and/or inspecting the condition of structures using remotely controlled devices such as drones.

BACKGROUND

Many buildings and other structures such as concrete structures are aging rapidly. Consequently, it has become increasingly important to determine and monitor the structural integrity of these structures. Systems and methods for testing structures such as concrete structures are slow, tedious, dangerous and expensive. The present disclosure relates to improved detection and analysis of faults, such as debonded cladding, deteriorating structural components, and failure in structures, including concrete structures and other structures, where such faults are located through use of non-contacting interrogation of the structure by a remotely controlled device equipped with an interrogation system.

Structures such as building facades, building structures, dams, bridges, power plants and off-shore platforms have failure modes that include delamination, debonding, connection failures, and cracking, as well as deterioration from fatigue, over stressing and ambient exposure. In addition to failure in service, these materials may also suffer from defects in manufacturing similar to those which occur under field stresses. Thus, a practical technique is needed for non-destructively locating faults in composite structures which is suitable to safely and cost effectively evaluate structures in the field.

Among known techniques for detecting delamination or debonding is that known as acoustic "scrubbing" wherein a small instrument containing an acoustic crystal is manually scanned across the object under examination through contact with the surface object while electronically "listening" for anomalies in the reflected acoustic wave. For small objects, this process is simple and efficient, but is much too time-consuming, and therefore prohibitively expensive, to be practical for evaluation of large components and structures.

Other techniques for locating faults in concrete structures involve either tapping on the surface of the structure with a hammer at different spots or dragging a chain bar across the surface of the structure. A sharp or ringing sound is produced by an intact, healthy structure. However, where a fault exists, a dull hollow sound is heard. These techniques have the advantage of being simple and inexpensive. However, while these techniques allow inspectors to inspect large structures in a shorter amount of time than is possible with some other nondestructive testing techniques, such as acoustic/ultrasonic methods, they are still very time-consuming. In addition, these techniques have the disadvantages of (a) relying on the subjective interpretation of the inspector; and (b) being difficult to implement in noisy environments, such as inspecting one lane of a bridge deck while traffic is driving in the other lanes. These disadvantages make it impractical for evaluation of most structures. These prior art techniques also require either physical contact between sensors and the surface to be tested, or at least close proximity between the two. These sound-based techniques also require physical access which is further time consuming, expensive and dangerous, requiring special-purpose scaffolding and equipment and highly-trained operators.

Alternative prior art techniques rely on systems that incorporate sonic/ultrasonic inspection technology (see, e.g., www.ndtcorporation.com/en/capabilities/sonic-ultrasonic-inspection) or ground penetrating radar inspection technology (see, e.g., www.ndtcorporation.com/en/capabilities/ground-penetrating-radar). These prior art techniques also require either physical contact between heavy hand-held equipment and the surface to be tested, or at least proximity between the two. Such contact or close proximity requirements prove to be a disadvantage when it is desired to conduct testing of an external structure, side-wall of a building, bridge, or other structures, which are at a high elevation or in an area with difficult accessibility.

Therefore, in view of these disadvantages, there is a need in the art for an improved system and method to detect and record structural (and other) faults in and on structures.

SUMMARY

The following presents a simplified summary of the invention in order to provide a basic understanding of some aspects of the invention. This summary is not an extensive overview of the invention. Rather than specifically identifying key or critical elements of the invention or to delineate the scope of the invention, its purpose, inter alia, is to present some concepts of the invention in a simplified form as a prelude to the more detailed description that is presented later.

The present disclosure relates to improved detection and analysis of faults, such as debonded cladding, deteriorating structural components, and failure in structures, including concrete structures and other structures, where such faults may be located through use of non-contacting interrogation of the structure by a remotely controlled device equipped with an acoustic interrogation system. In one embodiment, the acoustic interrogation system of the present disclosure may be deployed with the remotely controlled device alone or layered with one or more other technologies, including but not limited to digital images, Lidar, sonar, infrared sensors, radar, etc., in order to generate geotagged data points to be integrated into layered two dimensional or three dimensional models, depicting output results visually in a virtual model. In another embodiment, the disclosed system may process collected data via deep learning by a computer which will process all data sets, and via application of artificial intelligence, to recognize and categorize the data.

In one embodiment, the present disclosure describes an interrogation system that may be mounted on a drone. The drone may also include a remote flight control module for controlling the flight trajectory of the drone and a wireless communications module for communicating surveillance data captured in real-time to a ground base station and for transmitting and receiving flight control data to and from the ground base station. The interrogation system may include a processor or controller and an active sonar transceiver or an ultrasound transceiver. The interrogation system may also include a digital camera, a photogrammetry module, a thermographic camera, and/or a thermography module. The mapping module may include means for mapping the structure subject of the interrogation or inspection through use of one or more of a GPS module, a real-time kinematic (RTK) positioning module, a post-processed kinematic (PPK) module, or other positioning system module. In one embodiment, the mapping module generates 2D or 3D geotags.

In one embodiment, the drone with the interrogation system flies in proximity to a structure to be inspected in order to send acoustic signals (and optionally other types of signals such as radio, laser, infrared, etc.) to an area of interest and receive the signals backscattered from the area of interest. The backscattered signal may either be stored locally at the drone, or transmitted to a ground base station in real-time, together with any captured images, and mapping information. The backscattered signal, images and mapping information may be time-stamped by the processor or controller.

In one embodiment, the present disclosure describes a ground base station that includes a module or computer for controlling a flight trajectory of the drone. The ground base station may also include a receiver module for receiving inspection data from the drone, a data processing module for processing the inspection data, a database system for storing inspection data, a display for displaying the structure inspected along with detected faults in the structure, and an interrogator control module for controlling the interrogation system mounted on the drone. In one embodiment the flight control module may be integrated with the interrogation system control module.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following description of the invention when considered in conjunction with the drawings.

BRIEF DESCRIPTION OF THE DRAWINGS

The drawings, in which like numerals represent similar parts, illustrate generally, by way of example, but not by way of limitation, various embodiments discussed in the present document.

DETAILED DESCRIPTION

Figure 1:
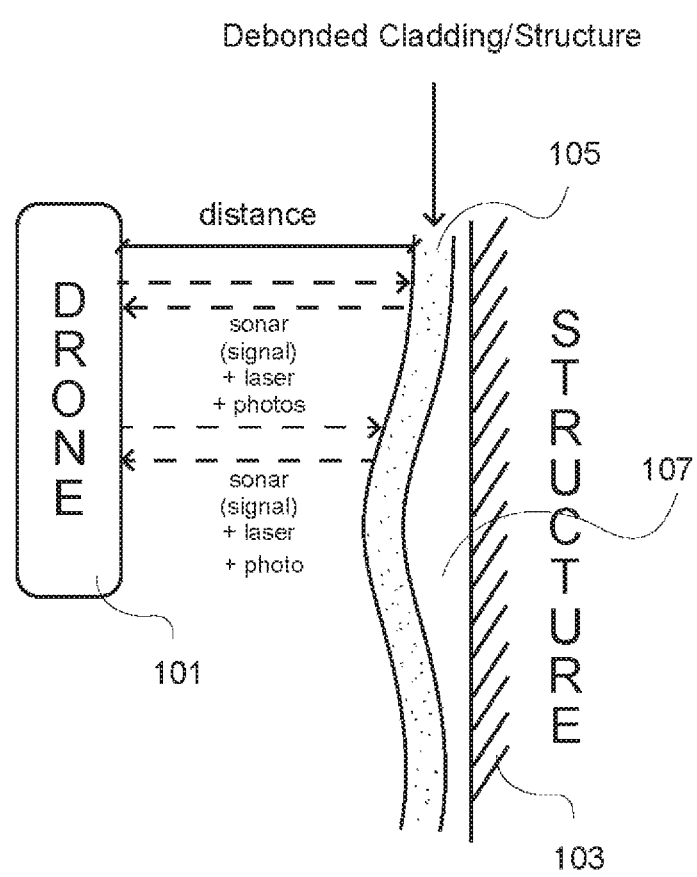
FIG. 1 illustrates an exemplary fault in a building structure which can be detected using the disclosed inspection system in accordance with one embodiment.

The foregoing summary, as well as the following detailed description of certain embodiments of the subject matter set forth herein, will be better understood when read in conjunction with the appended drawings. In the following detailed description, reference is made to the accompanying drawings which form a part hereof, and in which are shown by way of illustration specific embodiments in which the subject matter disclosed herein may be practiced. These embodiments, which are also referred to herein as "examples," are described in sufficient detail to enable those skilled in the art to practice the subject matter disclosed herein. It is to be understood that the embodiments may be combined or that other embodiments may be utilized, and that variations may be made without departing from the scope of the subject matter disclosed herein. Furthermore, references to "one embodiment" are not intended to be interpreted as excluding the existence of additional embodiments that also incorporate the recited features. The following detailed description is, therefore, not to be taken in a limiting sense, and the scope of the subject matter disclosed herein is defined by the appended claims and their equivalents.

In one embodiment, the inspection system disclosed herein may include an acoustic interrogation system mounted on a drone for surveying the condition of structures including, but not limited to, building facades, building structures, dams, bridges, power plants and off-shore platforms. The conditions inspected, tested, or surveyed include, but are not limited to, honeycombing of concrete, debonded (spalled concrete), debonded stucco and other types of cladding, blistering in roofing and other coatings, cracking, settlement, voids, distortion of structures, etc. The inspection system may also generate geometric measurements (distance) conditions in terms of "trueness" or out of plane/bulging which would also be indicative of potential defects or faults in a structure.

In one embodiment, the inspection system may use a sonar transceiver or an ultrasound transceiver to send a sound wave or "ping" from the drone through the air to the structure, and then receive a backscattered acoustic signal, measuring the received tone or sound which may then be plotted for interpretation and calibration based upon the type of structure being inspected, tested or surveyed. Geopositioned data may also be collected and time-stamped by the inspection system, which may be plotted over a 2D image or 3D image of the structure also captured by the drone. In one embodiment, underwater sonars or ultrasound transceivers may be mounted on underwater drones to inspect piers, dams and sea walls.

In one embodiment, the sonar or ultrasound transceiver system may provide the acoustic location and measurement of the echo characteristics of structure being tested, which may be compared with a stored acoustic signature of the structure. In sonar and ultrasound systems, as the audio signal is transmitted to the subject structure, the signal is scattered in all directions but not uniformly. The sonar or ultrasound image from the returning echo is composed of the backscattered energy that returns to the sonar or ultra sound receiver. The intensity of this backscatter, and hence the brightness of the image, depends on both the properties of the system (for example, amplitude of the signal, frequency, and bandwidth), and the characteristics of the structure. In most cases, a strong backscatter means the material is relatively hard or contains a lot of texture. The acoustic reflectivity is affected by the acoustic impedance of the material, which in turn is determined by the physical properties of the material including porosity, thickness, and structure. Input regarding structure type and materials may be used for calibrations of the inspection system.

In one embodiment, the sonar or ultrasound transceiver system may be combined with additional interrogation systems, such as for example, radar-based, infrared ("IR"), and Lidar, to generate "snapshots" of the data collected with respect to the structure under inspection (e.g., based on the collected acoustic, radar, IR and lidar data), which may then be geotagged in 3D with a high level of granularity or resolution. This geotagged data is superimposed on images of the structure captured with a camera in order to build a virtual structure, for example. The virtual structure may be implemented as a digital model of the structure under inspection showing planar distortions, for example.

FIG. 1 illustrates an exemplary fault 107 in a building structure 103 (shown as, but not limited to, an air gap due to debonding) which can be detected using the disclosed inspection system (mounted on drone 101) in accordance with one embodiment. The fault 107 may be caused by debonded cladding 105. In the illustrated embodiment of FIG. 1, the drone may include cameras that may be used to detect apparent bulging of the cladding. The drone may then be controlled so that it approaches the section with the bulge to proceed with the acoustic interrogation directed to that area. Alternatively, the entire structure may be interrogated through use of the sonar or ultrasound transceiver system. The frequency used for the interrogation signal may vary depending on the type of cladding or building material to be tested based on the resonant frequency of the building material, for example. In another embodiment, the structure may also be inspected through use of Lidar, radar or IR cameras.

It is known in the art that the specific acoustic impedance of air greatly varies from the specific acoustic impedance of building materials. For example, an approximate specific acoustic impedance for air is 0.4 kg/(m$^2$ s), for concrete is 7 to $10\times10^6$ kg/(m$^2$ s), for soil is 0.3 to $4\times10^6$ kg/(m$^2$s), and for steel is 0.3 to $4\times10^6$ kg/(m$^2$ s). Because the acoustic impedance of air can be neglected compared to building materials, the reflection coefficient (R) at air interfaces is R=1. When the impedance of material 2 is greater than for material 1 (with the acoustic wave passing from material 1 to material 2), the sign of R is positive. When the acoustic impedance of the material 2 is smaller than for material 1, the sign of R is negative, that means that a phase jump of 180° appears for the reflected acoustic ping. This effect allows principally distinguishing between the reflection at a concrete/cladding interface and reflection at the concrete/air interface, for example, because of its difference in the phase value. In accordance with one embodiment, the backscattered signal which is received by the sonar or ultrasound transceivers may be analyzed by use of digital signal processing techniques to detect phase changes based on the transmission and reflection of the acoustic wave through the air-cladding-fault (air)-concrete interfaces. For example, an air gap 107 formed between the debonded cladding 105 and a concrete structure 103 will generate a phase shift in the backscattered interrogation signal which may be analyzed to detect the presence of a fault.

In one embodiment, the interrogation system may inspect an area of interest by pinging different sections of the area and measuring the distance between the drone and the area of interest as it moves parallel to the structure. FIG. 1 illustrates two instances of pinging, where the distance between the bonded cladding (the upper portion of cladding 105) and the drone is larger than the distance between the drone and the debonded cladding (middle portion of cladding 105). The distance may be measured by calculating the time it would take the interrogation signal to bounce back.

The shorter distance measurement—when compared to most other areas of the building—may indicate the presence of a fault.

Figure 6:
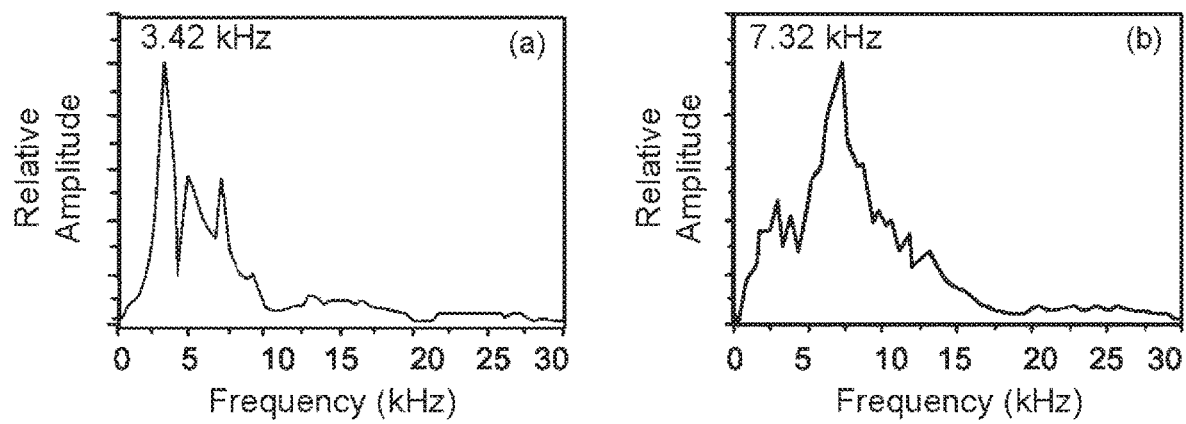
FIG. 6 illustrates an exemplary graph of a time of arrival measurement of a backscattered acoustic signal in the frequency domain.

In one embodiment, the time it takes the interrogation signal to bounce back may be processed in the frequency domain to ascertain the presence of a fault. FIG. 6 illustrates an exemplary graph of a time of arrival measurement of a backscattered acoustic signal in the frequency domain. Because the impedance between the cladding and the air vary greatly, when the acoustic interrogation signal travels through the cladding, for example, and encounters an interface with air (107), there is almost total reflection at the interface. The received acoustic signal backscattered by the cladding 105 and air 107 interface, when analyzed in the frequency domain will result in a plot showing a higher frequency (related to time of arrival and not the frequency of the interrogation signal), as shown on the right section of FIG. 6, when compared to a received acoustic signal backscattered by the cladding 105 and concrete 103 interface, as shown on the left section of FIG. 6.

Figure 2:
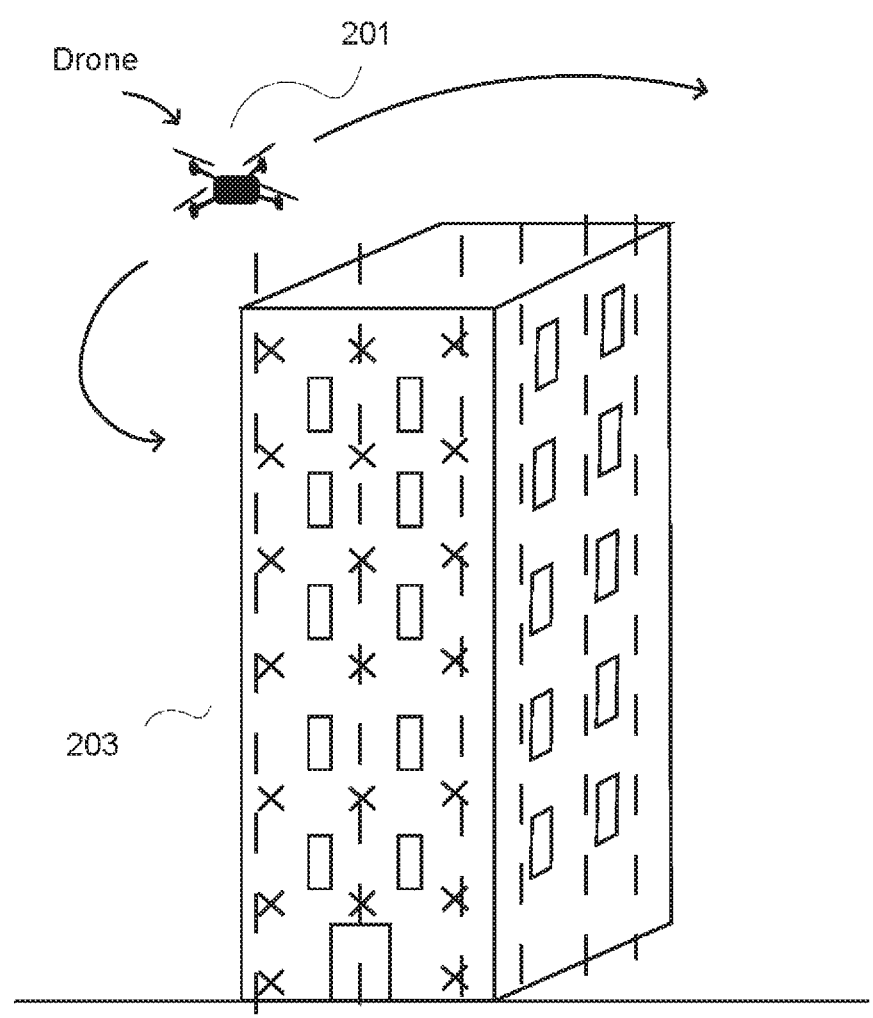
FIG. 2 illustrates an exemplary flight trajectory of a drone having an inspection system mounted thereon in accordance with one embodiment.

FIG. 2 illustrates an exemplary flight trajectory of a drone 201 having an inspection system mounted thereon in accordance with one embodiment. In one embodiment, the drone 201 may fly around the building 203 to create a map of the building 203. For example, the drone 201 may obtain thousands of data points by transmitting "pings" or acoustic signals aimed at the structure and also may obtain the visual condition of the location, the exact coordinates (e.g., the drone may use a GPS to determine relative physical building point locations) and may also layer the thermography on top of the same coordinates. In one embodiment, the drone may use GPS data points to determine relative physical building point locations and by recording the data points, a virtual model of the building can be created. Each data point can then also have an acoustic (sonar) visual (camera), and/or thermal (IR) corresponding information.

In one embodiment, the drone 201 may fly in a 2D plane parallel to a building 203 wall to capture data points related to the distance between the drone and the area of the building being inspected (referred herein as the "drone-to-structure distance map"). The drone-to-structure distance map may also include location information in order to identify the location of the drone and/or the data point corresponding to the area being inspected. If there are some data points that would reveal shorter distances between the drone 201 and the building 203 wall for certain areas, then these areas may be flagged as potentially having a fault. For example, in the simplified reading below, the "=" symbol represents an average uniform distance between the drone 201 and the area of interest being inspected, where the "-" symbol represents a decreased distance between the drone 201 and the area of interest in relation to the rest of the measured distances "=". Thus, the simplified reading below would indicate a fault or bulge right in the middle of the inspected area:

= = = = = = = = = = = = = =
= = = = = - - - = = = = = =
= = = = = = = = = = = = = =

The drone-to-structure distance map may be generated based on the raw distance data captured by the interrogation system, or the raw generated data may be correlated or autocorrelated in order to identify the potential faults in the structure, as appreciated by a person of ordinary skill in the art.

In one embodiment, an entire structure may be interrogated with the sonar or ultrasound transceiver in a first pass to create an overall drone-to-structure distance map. Upon review or processing of the distance data points in the drone-to-structure distance map, and optionally a review or processing of photogrammetry and/or thermography data associated with the distance data points and captured by cameras mounted on the drone, a report of faults in the structure may be generated. In one embodiment, the drone may then be directed to re-inspect the areas identified as having faults for additional testing by using, for example, the phase or frequency analysis of the backscattered acoustic signal discussed above in order to confirm the location of the faults. Preferably, the drone may collect all data of interest in a single flight mission, and the processor would then create a virtual model of the structure including layers of data visually overlaid for analysis. In another embodiment, the disclosed system may process collected data via deep learning by a computer which will process all data sets, and via application of artificial intelligence, to recognize and categorize the data.

Figure 3:
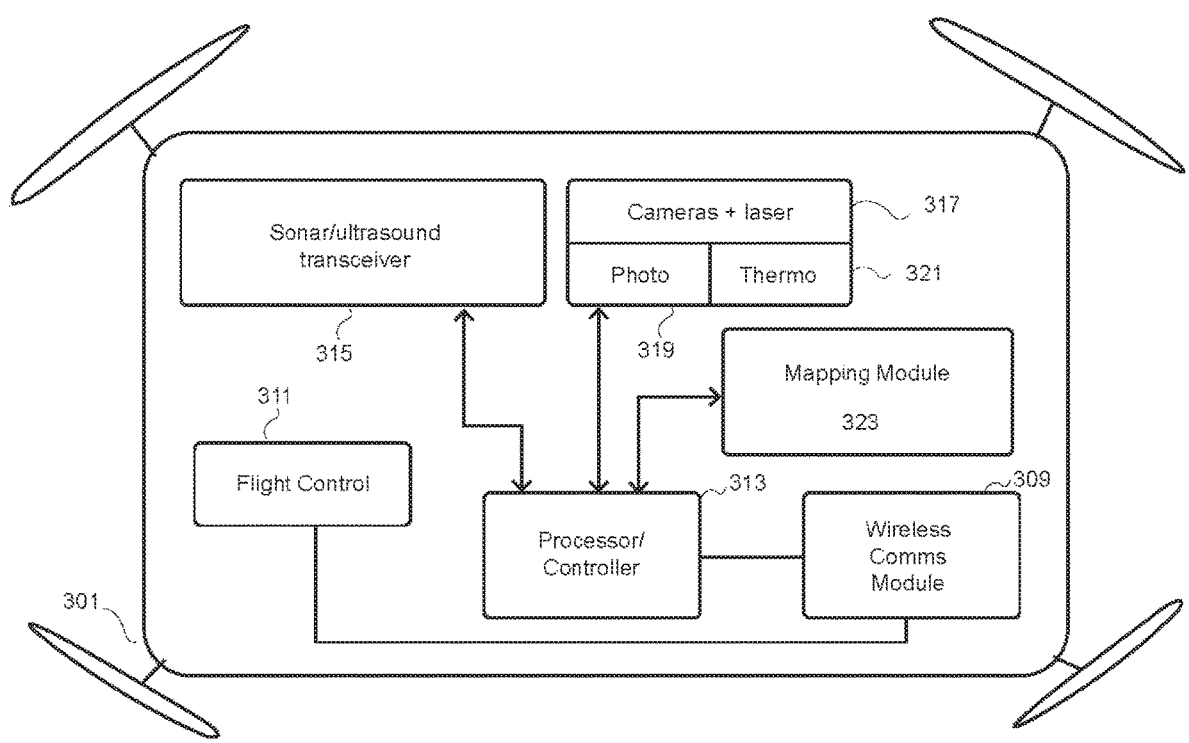
FIG. 3 illustrates the different modules mounted on a drone in accordance with one embodiment.

FIG. 3 illustrates different modules mounted on a drone 301 in accordance with one embodiment. The drone may include a remote flight control module 311 for controlling the flight trajectory of the drone based on control signals sent from a ground base station (illustrated in FIG. 5) or hand held remote control, and a wireless communications module 309 for communicating surveillance or inspection data captured in real-time by the interrogation system mounted on the drone to a ground base station (illustrated in FIG. 5), and for transmitting and receiving flight control data to and from the ground base station. In one embodiment, the wireless communications module may include submodules, with each submodule having a corresponding wireless transceiver.

The interrogation system mounted on the drone 301 may include a processor or controller 313 and an active sonar transceiver or an ultrasound transceiver 315. The interrogation system may also include a laser/Lidar transceiver and/or camera(s) 317 (which may include a digital camera, a thermographic camera, any other type of camera, or a combination thereof), a photogrammetry module 319, and/or a thermography module 321. The mapping module 323 may include means for mapping the structure subject of the interrogation or inspection through use of one or more of a GPS module, a real-time kinematic (RTK) positioning module, a post-processed kinematic (PPK) module, or other positioning system module.

In one embodiment, the drone 301 with the interrogation system flies in proximity to a structure to be inspected in order to send acoustic signals to an area of interest and receive the acoustic signals backscattered from the area of interest. The backscattered signal may either be stored locally at the drone, or transmitted to a ground base station in real-time, together with any captured images, and mapping information. The backscattered signal, images and mapping information may be time-stamped by the processor or controller 313.

In one embodiment, the processor 313 may control the operation of laser/Lidar transceiver and/or cameras 317 and sonar or ultrasonic transceiver 315 based on control signals received from the ground base station or in an automated fashion based on programming of the processor. The processor 313 may also control photogrammetry module 319 and/or thermography module 321.

Figure 4:
FIG. 4 illustrates exemplary data that may be transmitted to a ground base station form a drone in accordance with one embodiment.

In one embodiment, the processor 313 receives the backscattered signal information from the sonar or ultrasonic transceiver 315, assigns location or mapping information to the received backscattered signal information based on location data generated by the mapping module 323, and adds a timestamp to the backscattered signal information and the location information before forwarding the gathered data to the ground base station through wireless communications module 309 for further processing. In an alternative embodiment, the processor combines the backscattered signal information and the location information with the output from thermographic and/or digital camera 317, and/or from photogrammetry module 319 and/or thermography module 321, and adds a timestamp to the gathered information before forwarding the gathered data to the ground base station through wireless communications module 309 for further processing. FIG. 4 illustrates an exemplary data "snapshot" that may be transmitted to a ground base station from a drone in accordance with one embodiment.

Referring to FIG. 3, in one embodiment, the sonar or ultrasonic transceiver 315 emits acoustic signals in a range that may match the resonant frequency of building materials to be tested. In one embodiment, the sonar or ultrasonic transceiver 315 may include one or more transceivers to emit narrowband or wideband acoustic signals, within an audible range, or a range of approximately 40 kHz to 2 MHz.

In one embodiment, the sonar or ultrasonic transceiver 315 may include a coupling medium for efficient coupling of sound or ultrasound into air. The coupling medium may include one or more impedance matching layers to match the impedance of the transceiver and air, thereby transmitting a maximum amount of signal power without attenuation taking place at the transceiver. In one embodiment, the one or more impedance matching layers may include Aluminum, plexiglass, or piezoelectric material.

Figure 5:
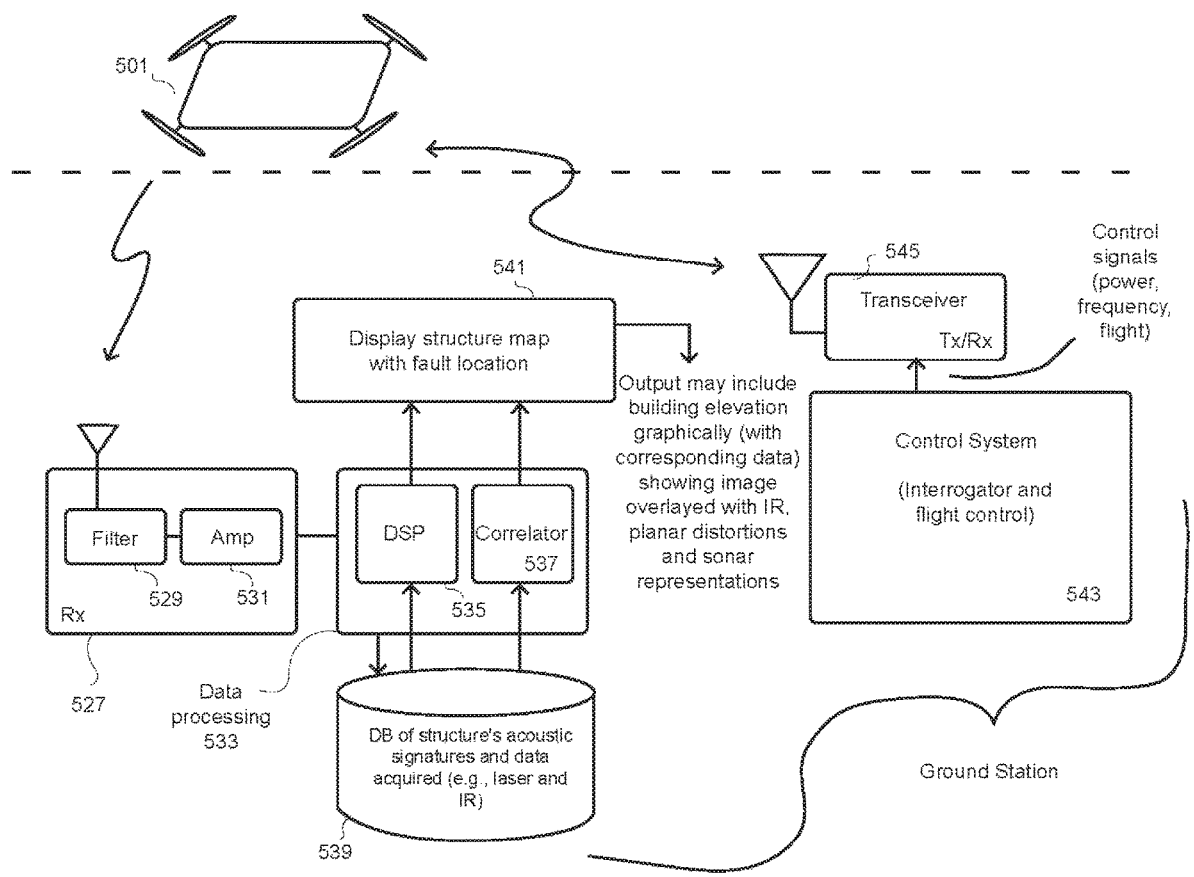
FIG. 5 illustrates components of a ground base station in accordance with one embodiment.

FIG. 5 illustrates components of a ground base station for controlling a flight trajectory of the drone 501 and for processing inspection data sent by the drone 501. In one embodiment, the ground base station includes a module or computer for controlling a flight trajectory of the drone. The ground base station may also include a receiver module 527 for receiving inspection data from the drone, a data processing module 533 for processing the inspection data, a database system 539 for storing inspection data, a display 541 for displaying the structure inspected along with detected faults in the structure, and an interrogator control module for controlling the interrogation system mounted on the drone. In one embodiment the flight control module may be integrated with the interrogation system control module (integrated module 543).

The receiver module 527 may include a filter 529 in order to filter out signals that may cause interference and/or saturate the amplifier 531. The filtered and amplified signal may be downconverted to a base band signal or it may be fed without downconversion to a digital signal processing ("DSP") module 535 in the data processing unit 533. The DSP 535 may be used to analyze the backscattered acoustic signals to generate a map of the building structure identifying faults overlaid on the map. The DSP may also generate the map by generating detailed images of the structure based on the information generated by one or more of the cameras and/or Lidar transceiver 317 and/or modules 319 and/or 321. The different type of maps generated by the DSP may be displayed on display 541.

In one embodiment, the DSP may also be used to analyze the backscattered signal information in the time domain or the frequency domain to detect faults in the structure by analyzing phase shifts in the received signal, time-of-arrival information in the frequency domain, or to generate a drone-to-structure distance map, as explained above. In one embodiment, the DSP 535 may detect faults in the structure by comparing the received backscattered signal information with data stored in a database 539 which corresponds to acoustic signatures of structures without faults, depending on the type of material of the structure being tested.

In one embodiment, the data processing unit 533 may include a correlator module 537, which may stand alone or may be combined with the DSP 535. In one embodiment, the correlator module 537 may be used to perform correlation analysis of the backscattered signal information when compared with data stored in a database 539 which corresponds to acoustic signatures of structures without faults, depending on the type of material of the structure being tested. Alternatively, the correlator module 537 may perform an autocorrelation analysis on the backscattered signal information in order to detect faults, based on a distance from the drone to a surface of the structure under inspection. The faults identified by the correlation module 537 may be overlaid on a map of the structure and displayed on display 541. In one embodiment, the display 541 may output graphical structure information, including building elevation (with corresponding data), showing and image of the structure overlaid with IR data, and showing planar distortions and sonar representations.

The database 539 may store acoustic signature information for different structure materials. The database 539 may also store any information gathered by the drone 501, including IR and laser/Lidar based data, or generated by the data processing module 533.

Users of the disclosed inspection system may decide to conduct additional testing or surveillance based on a visual inspection of the images displayed on display 541. In the event that additional surveillance is desired, the user may control the flight trajectory of the drone and the interrogation system through use of the control module 543. The control information may be relayed to the drone 501 through transceiver 545.

Figure 7:
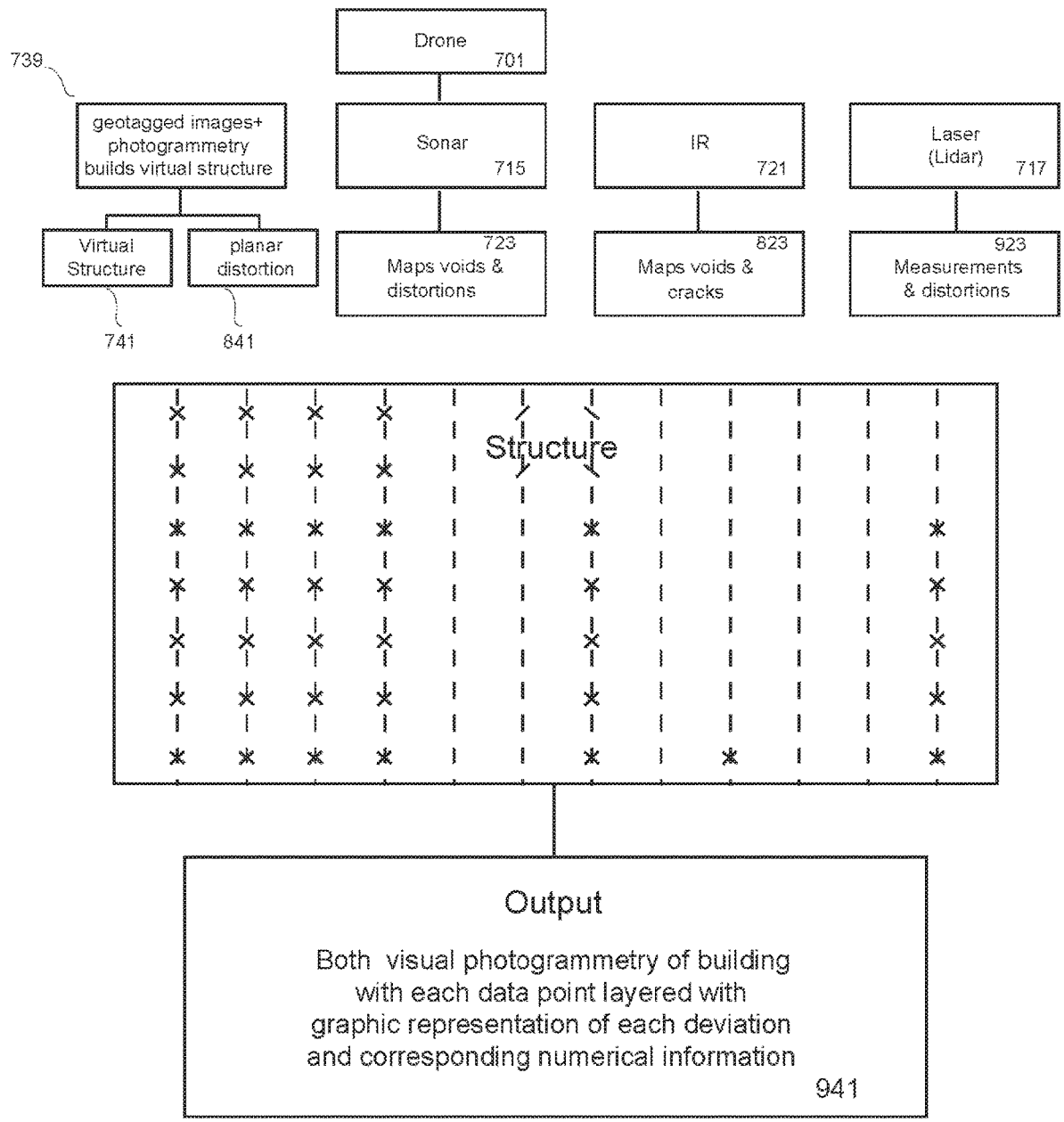
FIG. 7 illustrates a modular view of the inspection system in accordance with one embodiment.

FIG. 7 illustrates a modular view of a system for inspecting a structure in accordance with one embodiment. The inspection system may include an interrogation system mounted on a drone 701 that may include sonar/ultrasound transceiver 701; an infrared ("IR") camera or sensor 721; and/or a laser/lidar transceiver 717. The sonar/ultrasound transceiver 701 may generate an acoustic interrogation signal and the signal reflected or backscattered from the structure may be used to generate a map 723 of voids and distortions (e.g., changes in the shape of a section of the structure due to weather or mechanical forces) in the structure. The infrared ("IR") camera or sensor 721 may capture IR images of the structure which may be used to generate a map 823 of voids and cracks in the structure. The laser/lidar transceiver may generate laser beams and the reflected laser light may be used to generate a map 923 of distance measurements (e.g., between drone and surface of structure) and distortions. As the drone 701 flies around the structure, the inspection system generates the maps 723, 823, and 923 as a collection of "snapshots" (e.g., based on the collected acoustic, IR and lidar data) that are geotagged in 3D with a high level of granularity or resolution. This geotagged data is superimposed on images of the structure captured with a camera in order to build a virtual structure 741, for example, through use of module 739. The module 739 may also be used to identify planar distortions 841 in the structure. In one embodiment, the inspection system of FIG. 7 may generate visual photogrammetry of a structure, such as a building, with each data point (e.g., geotagged acoustic, lidar or radar, and or IR) layered with a graphic representation of each deviation and corresponding numerical information such as planar distortions, calibrated sonar values, thermographic values, etc.

Figure 8:
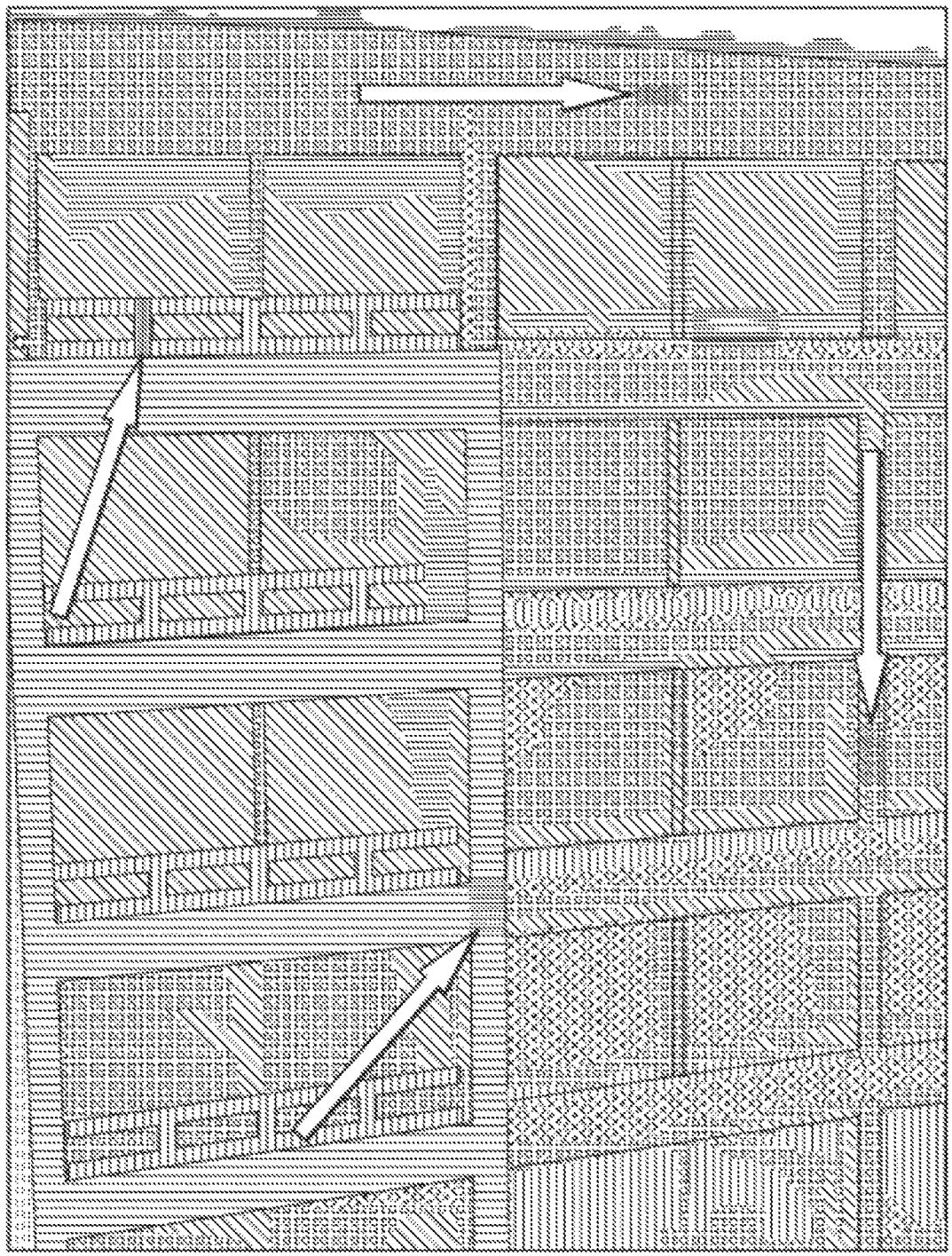
FIG. 8 illustrates a grayscale image of an inspected structure generated using the system of the present disclosure in accordance with one embodiment.

FIG. 8 illustrates a grayscale image of an inspected structure generated using the system of the present disclosure in accordance with one embodiment. The inspection system may generate a color image of the inspected structure, with different colors representing different construction materials or temperatures, for example. The illustrated image is a grayscale version of a color image. For each different color in a generated image, the system may identify the darkest shade spots for each color in order to identify a potential fault. In the image of FIG. 8, each arrow points to such darkest shade spots.

The various embodiments and/or components, for example, the modules, elements, or components and controllers therein, also may be implemented as part of one or more computers or processors or they may be implemented as software modules or components. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor. Also, the term "computer" or "module" may include any processor-based or microprocessor-based system including systems using microcontrollers, reduced instruction set computers (RISC), application specific integrated circuits (ASICs), field-programmable gate arrays (FPGAs), graphical processing units (GPUs), logic circuits, and any other circuit or processor capable of executing the functions described herein. The above examples are exemplary only, and are thus not intended to limit in any way the definition and/or meaning of the term "computer."

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible, non-transitory computer-readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software", "firmware" and "algorithm" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. Specifically, some of the components of the ground base station may be mounted on the drone, while some of the drone components may be incorporated in the ground base station. Further, while the disclosure has been described with respect to a drone, any remotely controlled device (e.g., aerial, terrestrial or submarine) equipped with the disclosed interrogation system may be used. In addition, many modifications may be made to adapt a particular situation or material to the teachings of the invention without departing from its scope. While the dimensions, types of materials and structures described herein are intended to illustrate the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled.

As used herein, an element or step recited in the singular and proceeded with the word "a" or "an" should be understood as not excluding plural of said elements or steps, unless such exclusion is explicitly stated. Moreover, unless explicitly stated to the contrary, embodiments "comprising" or "having" an element or a plurality of elements having a particular property may include additional such elements not having that property. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. 112(f), unless and until such claim limitations expressly use the phrase "means for" followed by a statement of function void of further structure.

The invention claimed is:

1. A remotely controlled device for inspecting a structure without physically contacting the structure comprising:
    a sonar/ultrasound transceiver for transmitting acoustic/ultrasound signals in the direction of a plurality of surfaces of the structure as the remotely controlled device moves along or around a perimeter of the structure without the sonar/ultrasound transceiver contacting the structure and for receiving acoustic/ultrasound signals backscattered from said plurality of surfaces of the structure without the sonar/ultrasound transceiver contacting the structure
    a mapping module for generating geotags identifying coordinate data corresponding to said surfaces of the structure in synchronization with said transmitting of said acoustic/ultrasound signals; and
    a processor for receiving said backscattered acoustic/ultrasound signals, and said geotags, assembling data packets containing said backscattered acoustic/ultrasound signals and said geotags, and inserting a time stamp for each of said packets,
    wherein the processor processes said backscattered sonar/ultrasound signals to detect the locations and presence of voids or distortions in the structure and said mapping module generates geotags for said voids or distortions and corresponding data points.

2. The remotely controlled device of claim 1, further comprising a camera for capturing photo images of said plurality of surfaces of the structure in synchronization with said transmitting of said acoustic/ultrasound signals.

3. The remotely controlled device of claim 2, wherein the processor is configured to further receive said photo images, and said packets further include said photo images, and wherein said mapping module further generates geotags for said photo images.

4. The remotely controlled device of claim 2, wherein the processor processes said photo images to generate a virtual model of the structure and overlays geotagged data corresponding to said voids or distortions on said virtual model.

5. The remotely controlled device of claim 1, wherein the processor detects the locations and presence of voids or distortions at least based on measured distances between the remotely controlled device and the structure as the remotely controlled device is moved along or around a perimeter of the structure.

6. The remotely controlled device of claim 1, further comprising:
    an infrared camera or sensor for capturing infrared images or infrared data of said plurality of surfaces of the structure in synchronization with said transmitting of said acoustic/ultrasound signals;
    wherein said processor further receives said infrared images or infrared data, and further assembles said data packets by inserting said infrared images or infrared data into said data packets.

7. The remotely controlled device of claim 6, wherein the processor processes said infrared images or infrared data to detect voids or cracks in the structure and said mapping module generates geotags for said infrared images and corresponding data points.

8. The remotely controlled device of claim 1, further comprising:
    a laser/lidar transceiver for transmitting laser signals in the direction of said plurality of surfaces of the structure in synchronization with said transmitting of said acoustic/ultrasound signals and for receiving laser signals backscattered from said plurality of surfaces of the structure;
    wherein said processor further receives said backscattered laser signals, and further assembles said data packets by inserting said backscattered laser signals into said data packets.

9. The remotely controlled device of claim 6, wherein the processor processes said backscattered laser signals to generate distance measurements or detect distortions in the structure and said mapping module generates geotags for said distortions.

10. The remotely controlled device of claim 1, wherein said geotags are 3D geotags.

11. The remotely controlled device of claim 1, wherein
    the backscattered signal received by the sonar/ultrasound transceiver is analyzed to detect phase changes,
    the sonar/ultrasound transceiver includes a coupling medium for efficient coupling of sound or ultrasound into air, said coupling medium including one or more impedance matching layers to match the impedance of the transceiver and air, and said one or more impedance matching layers being comprised of Aluminum, plexiglass, or a piezoelectric material, and the remotely controlled device processes said data packets, said time stamps, and said geotags through an artificial intelligence application to recognize and categorize all collected data.

12. A system for inspecting a structure without physically contacting the structure comprising:

a remotely controlled device comprising, a sonar/ultrasound transceiver for transmitting acoustic/ultrasound signals in the direction of a plurality of surfaces of the structure as the remotely controlled device moves along or around a perimeter of the structure without the sonar/ultrasound transceiver contacting the structure and for receiving acoustic/ultrasound signals backscattered from said plurality of surfaces of the structure without the sonar/ultrasound transceiver contacting the structure, a mapping module for generating geotags identifying coordinate data corresponding to said surfaces of the structure in synchronization with said transmitting of said acoustic/ultrasound signals, and a first processor for receiving said backscattered acoustic/ultrasound signals and said geotags, assembling data packets containing said backscattered acoustic/ultrasound signals and said geotags, and inserting a time stamp for each of said packets; and a base station comprising a second processor for receiving and processing said packets, wherein the second processor processes said backscattered sonar/ultrasound signals in said packets to detect the locations and presence of voids or distortions in the structure at least based on measured distances between the remotely controlled device and the structure.

13. The system of claim 12 further comprising a camera for capturing photo images of said plurality of surfaces of the structure in synchronization with said transmitting of said acoustic/ultrasound signals, and wherein said first processor is further configured to receive said photo images and said data packets containing said images.

14. The system of claim 13, wherein said second processor processes said photo images to generate a virtual model of the structure and overlays geotagged data corresponding to said voids or distortions on said virtual model.

15. The system of claim 12, wherein said second processor detects the locations and presence of voids or distortions at least based on measured distances between the remotely controlled device and the structure as the remotely controlled device is moved along or around a perimeter of the structure.

16. The system of claim 12, wherein the remotely controlled device further comprises:

a laser/lidar transceiver for transmitting laser signals in the direction of a plurality of surfaces of the structure in synchronization with said transmitting of said acoustic/ultrasound signals and for receiving laser signals backscattered from said plurality of surfaces of the structure;

wherein said first processor further receives said backscattered laser signals, and further assembles said data packets by inserting said backscattered laser signals into said data packets.

17. The system of claim 16, wherein the second processor processes said backscattered laser signals to generate distance measurements or detect distortions in the structure.

18. The system of claim 12, wherein the remotely controlled device further comprises:

an infrared camera or sensor for capturing infrared images or infrared data of said plurality of surfaces of the structure in synchronization with said transmitting of said acoustic/ultrasound signals;

wherein said first processor further receives said infrared images or infrared data, and further assembles said data packets by inserting said infrared images or infrared data into said data packets.

19. The system of claim 18, wherein the second processor processes said infrared images or infrared data to detect voids or cracks in the structure.

20. The system of claim 12, wherein the backscattered signal received by the sonar/ultrasound transceiver is analyzed to detect phase changes, the sonar/ultrasound transceiver includes a coupling medium for efficient coupling of sound or ultrasound into air, said coupling medium including one or more impedance matching layers to match the impedance of the transceiver and air, and said one or more impedance matching layers being comprised of Aluminum, plexiglass, or a piezoelectric material, and the base station processes said data packets, said time stamps, and said geotags through an artificial intelligence application to recognize and categorize all collected data.

* * * * *